(12) United States Patent
Haba et al.

(10) Patent No.: US 9,030,017 B2
(45) Date of Patent: May 12, 2015

(54) Z-CONNECTION USING ELECTROLESS PLATING

(71) Applicant: Invensas Corporation, San Jose, CA (US)

(72) Inventors: Belgacem Haba, Saratoga, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/675,445

(22) Filed: Nov. 13, 2012

(65) Prior Publication Data

US 2014/0131875 A1    May 15, 2014

(51) Int. Cl.
*H01L 23/532* (2006.01)
*H01L 21/50* (2006.01)
*H01L 23/498* (2006.01)

(52) U.S. Cl.
CPC .......... *H01L 23/53209* (2013.01); *H01L 21/50* (2013.01); *H01L 23/49827* (2013.01); *H01L 23/49833* (2013.01); *H01L 2224/16225* (2013.01); *H01L 2225/1023* (2013.01); *H01L 2225/107* (2013.01); *H01L 2924/15311* (2013.01)

(58) Field of Classification Search
USPC .................. 257/773, 774, 778, 737, 738, 734, 257/E23.067, 700.701, 758, 762, 766, 777; 438/125
See application file for complete search history.

(56) References Cited

U.S. PATENT DOCUMENTS

| 5,876,842 | A | 3/1999 | Duffy et al. |
| 6,242,279 | B1 * | 6/2001 | Ho et al. .................. 438/106 |
| 6,448,644 | B1 * | 9/2002 | Lin .......................... 257/734 |
| 8,476,770 | B2 * | 7/2013 | Shao et al. ................ 257/774 |
| 2001/0024839 | A1 | 9/2001 | Lin |
| 2009/0046441 | A1 | 2/2009 | Funaya et al. |
| 2010/0258927 | A1 | 10/2010 | Ganesan et al. |
| 2012/0313245 | A1 * | 12/2012 | Horiuchi et al. .......... 257/758 |
| 2013/0063854 | A1 * | 3/2013 | Soffer ...................... 361/103 |
| 2013/0069239 | A1 * | 3/2013 | Kim et al. ................. 257/774 |
| 2013/0182401 | A1 * | 7/2013 | Furutani et al. ........... 361/782 |
| 2013/0192884 | A1 * | 8/2013 | Furutani et al. ........... 174/258 |
| 2013/0241357 | A1 * | 9/2013 | Hayasaka et al. ......... 310/344 |
| 2013/0256007 | A1 * | 10/2013 | Furutani et al. ........... 174/255 |
| 2013/0284506 | A1 * | 10/2013 | Zanma et al. ............. 174/260 |

OTHER PUBLICATIONS

International Search Report and Written Opinion for Application No. PCT/US2013/069512 dated Mar. 6, 2014.

* cited by examiner

*Primary Examiner* — Alexander Oscar Williams
(74) *Attorney, Agent, or Firm* — Lerner, David, Littenberg, Krumholz & Mentlik, LLP (57) ABSTRACT

An assembly includes a substrate having a substrate conductor and a contact at a first surface and a terminal at a second surface for electrically interconnecting the assembly with a component external to the assembly, at least one of the substrate conductor or the contact being electrically connected with the terminal; a first element having a first surface facing the first surface of the substrate and having a first conductor at the first surface and a second conductor at a second surface, an interconnect structure extending through the first element electrically connecting the first and second conductors; an adhesive layer bonding the first surfaces of the first element and the substrate, at least portions of the first conductor and the substrate conductor being disposed beyond an edge of the adhesive layer; and a continuous electroless plated metal region extending between the first conductor and the substrate conductor.

27 Claims, 5 Drawing Sheets

Z-CONNECTION USING ELECTROLESS PLATING

FIELD OF THE INVENTION

The present application relates to microelectronic packages, components thereof and assemblies, e.g., package on package (PoP) assemblies, and more particularly to microelectronic packages, components and assemblies thereof which include continuous electroless plated metal regions that electrically connect pairs of conductors at respective surfaces thereof.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts exposed at the front surface. The contacts are electrically connected to the numerous electronic circuit elements formed integrally within the chip. Such a chip most commonly is provided in a package having a miniature circuit panel referred to as a substrate. The chip is typically mounted to the substrate with the front or rear surface overlying a surface of the substrate, and the substrate typically has terminals exposed at a surface of the substrate. The terminals are electrically connected to the contacts of the chip. The package typically also includes some form of covering overlying the chip on the side of the chip opposite from the substrate. The covering serves to protect the chip and, in some cases, the connections between the chip and the conductive elements of the substrate. Such a packaged chip, a microelectronic package, can be mounted to a circuit panel such as a circuit board by connecting the terminals of the substrate to conductive elements such as contact pads on the larger circuit panel.

In certain microelectronic packages, the chip is mounted with its front or back surface overlying an upper surface of the substrate, whereas terminals are provided on the oppositely facing lower surface. A mass of a dielectric material overlies the chip and, most typically, the electrical connections between the chip and the conductive elements of the substrate. The dielectric mass can be formed by molding a flowable dielectric composition around the chip so that the dielectric composition covers the chip and all or part of the top surface of the substrate. Such a package is commonly referred to as an "overmolded" package, and the mass of dielectric material is referred to as the "overmold." Overmolded packages are economical to manufacture and thus are widely used.

In some applications, it is desirable to stack chip packages on top of one another, so that plural chips can be provided in the same space on the surface of the larger circuit panel. Also, it is desirable to have a large number of input/output interconnections to the chips. Certain overmolded packages incorporate stacking contacts exposed at the top surface of the substrate outside of the area covered by the chip and, typically, outside of the area covered by the overmold. Such packages can be stacked one atop the other with interconnecting elements such as solder balls or other conductive connections extending between the stacking contacts of the lower package and the terminals of the next higher package in the stack. In such an arrangement, all of the packages in the stack are electrically connected to the terminals on the package at the bottom of the stack. In such an arrangement, however, all of the interconnecting elements must be accommodated in the limited region of the substrate outside of the area covered by the overmold. Moreover, because the substrate of the higher package in the stack sits above the dielectric overmold in the next lower package, there is an appreciable gap in the vertical direction between the terminals of the higher package and the stacking contacts of the lower package. The interconnecting elements must bridge this gap. This typically requires the interconnecting elements to be spaced at relatively large intervals. Therefore, the number of interconnecting elements which can be accommodated using a package substrate of a given size is limited.

Despite the considerable effort devoted in the art to development of stackable packages and other packages having top-surface mounting pads, further improvement would be desirable.

BRIEF SUMMARY OF THE INVENTION

Embodiments of an assembly are disclosed herein. In one embodiment, an assembly includes a substrate consisting essentially of dielectric material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal; a first element consisting essentially of dielectric material, having a first surface facing the first surface of the substrate and a second surface opposite the first surface, a first conductor at the first surface, a second conductor at the second surface, and interconnect structure extending through the first element electrically connecting the first and second conductors; an adhesive layer bonding the first surfaces of the first element and the substrate with one another, at least portions of the first conductor and the substrate conductor being disposed beyond an edge of the adhesive layer; and a continuous electroless plated metal region extending between the first conductor and the substrate conductor and extending to a height less than a height of the second surface of the first element above the first surface of the substrate.

In one embodiment, the continuous electroless plated metal region extends along the edge of the adhesive layer.

In one embodiment, the continuous electroless plated metal region includes a first metal region electrolessly plated onto the first conductor and a second metal region electrolessly plated onto the substrate conductor, each of the first and second metal regions including a first electroless plated metal layer and a second electroless plated metal layer covering the first layer.

In one embodiment, the first and second electroless plated metal layers are formed of one or more materials selected from the group consisting of cobalt (Co), nickel (Ni), copper (Cu), gold (Au), Co alloys, Ni alloys, Cu alloys, or Au alloys.

In one embodiment, each of the first conductor and the substrate conductor includes a metal at a surface thereof, wherein the continuous electroless plated metal region includes a metal different from the metal at the surfaces of the first conductor and the substrate conductor.

In one embodiment, the assembly further comprises an encapsulant covering the continuous electroless plated metal region.

In one embodiment, the electroless plated metal region exists only as a connection between the first and substrate conductors bridging a distance therebetween.

In one embodiment, a minimum distance between the first conductor and the substrate conductor is less than about 20 microns.

In one embodiment, the minimum distance is less than about 10 microns.

In one embodiment, the first conductor is one of a pad, a trace, or an array of pads.

In one embodiment, the second conductor is one of a pad, a trace, or an array of pads.

In one embodiment, the substrate conductor is one of a pad, a trace, or an array of pads.

In one embodiment, the first conductor is one of a plurality of first conductors at the first surface of the first element, the substrate conductor is one of a plurality of substrate conductors at the first surface of the substrate, and the continuous electroless plated metal region is one of a plurality of continuous electroless plated metal regions, each continuous electroless plated metal region extending between a first conductor of the plurality of first conductors and a corresponding substrate conductor of the plurality of substrate conductors, wherein the electroless plated metal regions formed on first and second adjacent pairs of one first conductor with one substrate conductor are spaced apart from one another.

In one embodiment, the second conductor is one of a plurality of second conductors exposed at the second surface of the first element, the plurality of second conductors being electrically connected with the plurality of first conductors by the interconnect structure.

In one embodiment, a minimum distance between each first conductor and a corresponding substrate conductor is less than 20 microns.

In one embodiment, the minimum distance is less than about 10 microns.

In one embodiment, a minimum first pitch between adjacent ones of the first conductors is less than about 200 microns.

In one embodiment, a minimum second pitch between adjacent ones of the substrate conductors is less than about 200 microns.

In one embodiment, each first conductor is spaced apart from the corresponding substrate conductor connected therewith by at least a minimum distance, at least a minimum first pitch is provided between adjacent ones of the first conductors and at least a minimum second pitch is provided between adjacent ones of the second conductors, wherein each of the first and second minimum pitches is greater than 1.2 times the minimum distance.

In one embodiment, the terminal is one of a plurality of terminals exposed at the second surface of the substrate.

In one embodiment, the substrate further comprises a plurality of second interconnect structures, each second interconnect structure extending in a direction between the first and second surfaces of the substrate, ones of the plurality of terminals electrically connected with ones of the plurality of substrate conductors through at least one second interconnect structure.

In one embodiment, ones of the plurality of terminals are electrically connected to ones of the plurality of second conductors through ones of the continuous electroless plated metal regions.

In one embodiment, the contact is one of a plurality of contacts at the surface of the substrate, the plurality of terminals being electrically connected with the contacts.

In one embodiment, the first element is in the form of an element having a framed region surrounding a central aperture, the central aperture sized to accommodate a microelectronic element.

In one embodiment, the assembly further comprises a first microelectronic element electrically connected with the contact, at least a portion of the thickness of the first microelectronic element being disposed within the central aperture of the first element.

In one embodiment, the first microelectronic element is electrically coupled to ones of the plurality of terminals through ones of the plurality of contacts.

In one embodiment, the first microelectronic element is electrically coupled to ones of the plurality of second conductors through ones of the plurality of substrate conductors.

In one embodiment, the assembly further comprises a second microelectronic element supported at the second surface of the first element.

In one embodiment, the second microelectronic element is electrically connected to ones of the plurality of terminals through ones of the plurality of second conductors.

In one embodiment, the second microelectronic element is electrically connected to the first microelectronic element through ones of the plurality of second conductors.

In one embodiment, a height of the second surface of the first element above the first surface of the substrate is greater than about 200 microns.

In one embodiment, at least one of the first element or the substrate consists essentially of a dielectric layer or a plurality of dielectric layers.

In one embodiment, the adhesive layer is one of a plurality of layers.

In one embodiment, the adhesive layer is comprised of an electrically insulating material.

In one embodiment, the adhesive layer is a conductive adhesive layer, the conductive adhesive layer insulated from the first conductor and the substrate conductor.

In one embodiment, the assembly further comprises one or more dielectric layers disposed between the adhesive layer and at least one of the first surface of the first element or the first surface of the substrate.

In one embodiment, an assembly includes a substrate consisting essentially of semiconductor material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal; a first element consisting essentially semiconductor material, having a first surface facing the first surface of the substrate and a second surface opposite the first surface, a first conductor at the first surface, a second conductor at the second surface, and a through silicon via extending through the first element electrically connecting the first and second conductors; an adhesive layer bonding the first surfaces of the first element and the substrate with one another, at least portions of the first conductor and the substrate conductor being disposed beyond an edge of the adhesive layer; and a continuous electroless plated metal region extending between the first conductor and the substrate conductor and extending to a height less than a height of the second surface of the first element above the first surface of the substrate.

In one embodiment, an assembly includes a substrate consisting essentially of dielectric material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal; a first element consisting essentially of dielectric material, having a first surface facing the first surface of the substrate and a second surface opposite the first surface, a first conductor at the first surface, a second conductor at the second surface, and interconnect structure extending through the first element electrically connecting the first and second conductors; an adhesive layer bonding the first surfaces of the first element and the substrate with one another, at least portions of the first conductor and the substrate conductor being disposed beyond an edge of the adhesive layer; a continuous electroless plated metal region extending between the first conductor and the substrate conductor and extending to a height less than a height of the second surface of the first element above the first surface of the substrate; a first microelectronic element electrically connected with at least one of the substrate conductor or the contact, at least a portion of the thickness of the first microelectronic element being disposed within the central aperture of the first element; and a second microelectronic element supported at the second surface of the first element, the second microelectronic element electrically connected with the second conductor.

In one embodiment, a method of forming an assembly includes assembling a first element and a substrate using an adhesive layer, wherein the substrate consists essentially of dielectric material, has a first surface, a second surface opposite the first surface, a substrate conductor and a contact at the first surface, and a terminal at the second surface for electrically interconnecting the assembly with a component external to the assembly, at least one of the substrate conductor or the contact being electrically connected with the terminal, the first element consists essentially of dielectric material, has a first surface facing the first surface of the substrate and a second surface opposite the first surface, a first conductor at the first surface, a second conductor at the second surface, and interconnect structure extending through the first element electrically connecting the first and second conductors, and the adhesive layer bonding the first surfaces of the first element and the substrate with one another, such that at least portions of the first conductor and the substrate conductor are exposed beyond an edge of the adhesive layer; and connecting the first conductor and substrate conductor by electrolessly plating first and second metal regions onto the first conductor and the substrate conductor such that the first and second plated metal regions merge together during the plating to form a continuous electroless plated metal region extending between the first conductor and the substrate conductor and extending to a height less than a height of the second surface of the first element above the first surface of the substrate.

In one embodiment, the first conductor is one of a plurality of first conductors, and the substrate conductor is one of a plurality of substrate conductors and wherein the step of connecting includes connecting each first conductor with a corresponding substrate conductor by a corresponding continuous electroless plated metal region formed during the electroless plating thereon, wherein each substrate conductor is electrically connected to a corresponding first conductor through one of the continuous electroless plated metal regions.

In one embodiment, the first element is in the form of an element having a framed region surrounding a central aperture, the central aperture sized to accommodate a microelectronic element.

In one embodiment, the second conductor is one of a plurality of second conductors electrically connected with the first conductors by the interconnect structure and the contact is one of a plurality of contacts. The method further comprises connecting a first microelectronic element with corresponding ones of the plurality of contacts and corresponding ones of the plurality of substrate conductors, at least a portion of the thickness of the first microelectronic element being disposed within the central aperture of the first element; and connecting a second microelectronic element at the second surface of the first element with corresponding ones of the plurality of second conductors.

In one embodiment, a method of forming an assembly includes assembling a first element and a substrate using an adhesive layer, wherein the substrate consists essentially of semiconductor material, has a first surface, a second surface opposite the first surface, a substrate conductor and a contact at the first surface, and a terminal at the second surface for electrically interconnecting the assembly with a component external to the assembly, at least one of the substrate conductor or the contact being electrically connected with the terminal, the first element consists essentially of semiconductor material, has a first surface facing the first surface of the substrate and a second surface opposite the first surface, a first conductor at the first surface, a second conductor at the second surface, and a through silicon via extending through the first element electrically connecting the first and second conductors, and the adhesive layer bonding the first surfaces of the first element and the substrate with one another, such that at least portions of the first conductor and the substrate conductor are exposed beyond an edge of the adhesive layer; and connecting the first conductor and substrate conductor by electrolessly plating first and second metal regions onto the first conductor and the substrate conductor such that the first and second plated metal regions merge together during the plating to form a continuous electroless plated metal region extending between the first conductor and the substrate conductor and extending to a height less than a height of the second surface of the first element above the first surface of the substrate.

BRIEF DESCRIPTION OF THE DRAWINGS

FIG. 1-1 depicts a side schematic view of an assembly in accordance with some embodiments of the present invention.

FIG. 1-2 depicts a top down schematic view of an assembly in accordance with some embodiments of the present invention.

FIG. 3A-1 depicts a side cross sectional view of a partially formed assembly in accordance with some embodiments of the present invention.

FIG. 3A-2 depicts a bottom up schematic view of a first element in accordance with some embodiments of the present invention.

FIG. 3A-3 depicts a top down schematic view of a first element in accordance with some embodiments of the present invention.

FIG. 3A-4 depicts a top down schematic view of a substrate in accordance with some embodiments of the present invention.

FIG. 3A-5 depicts a bottom up schematic view of a substrate in accordance with some embodiments of the present invention.

FIG. 3B-1 depicts side cross sectional view of a partially formed assembly in accordance with some embodiments of the present invention.

FIG. 3B-2 depicts side cross sectional view of a continuously electroless plated region between a first conductor and a substrate conductor in accordance with some embodiments of the present invention.

DETAILED DESCRIPTION

Embodiments of a microelectronic assembly and method for making the same are disclosed herein. The assembly may include continuous electroless plated metal regions extending between conductors in the assembly, which may allow for a finer pitch between adjacent conductors and a higher density of conductors in the microelectronic assembly. The method, which can utilize electroless plating to form the continuous electroless plated metal region can reduce costs and/or production time by removing process steps, such a lithography, which can be used to electrically connect conductors. Other and further characteristics or advantages of the microelectronic assembly and method of making the same are discussed herein.

Figure 11:
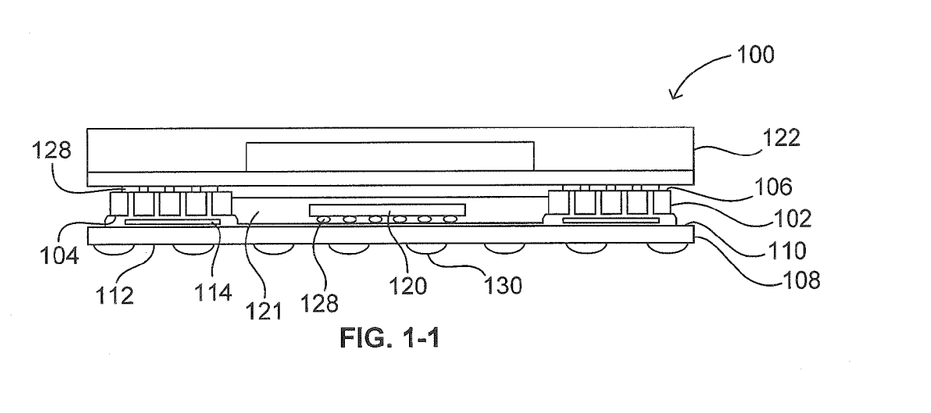
Figure 12:
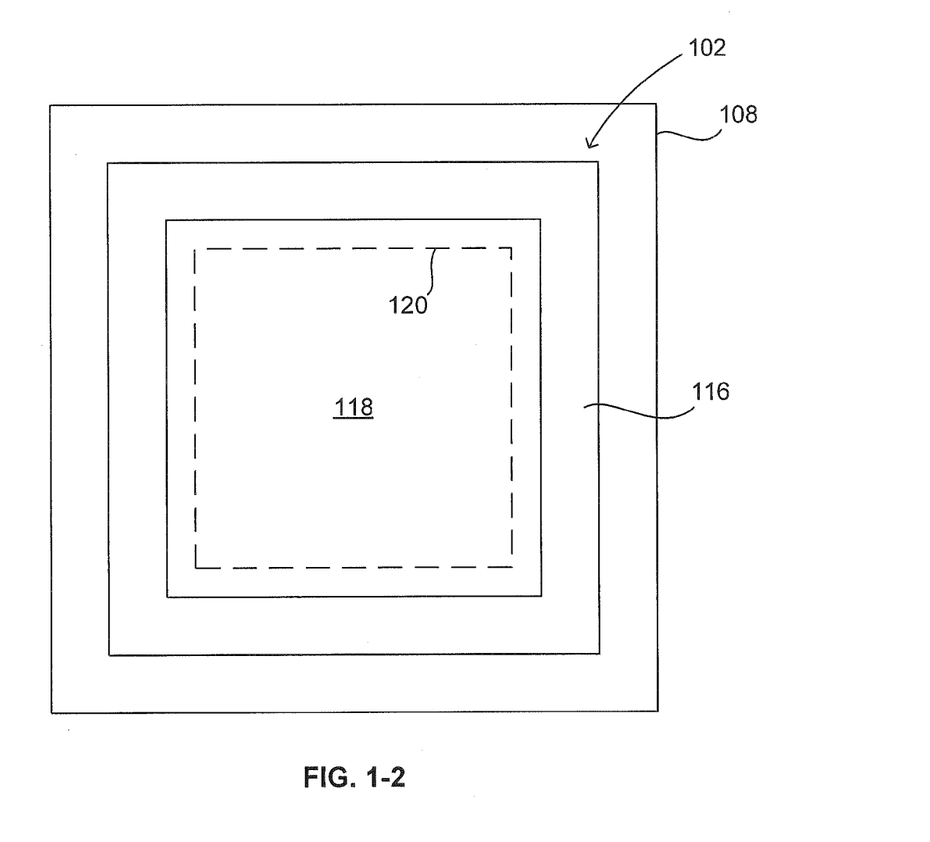

FIG. 1-1 depicts a cross section view of a microelectronic assembly 100 in accordance with some embodiments of the present invention. As illustrated in FIG. 1-1, the microelectronic assembly 100 may include a first element 102 having a first surface 104 and second surface 106 opposite the first surface 104. A substrate 108 may have a first surface 110 facing the first surface 104 of the first element 102 and a second surface 112 opposite the first surface 110 of the substrate 108. An adhesive layer 114 may bond the first surfaces 104, 110 with one another. In one embodiment, a height of the second surface 106 of the first element 102 above the first surface 110 of the substrate 108 may be greater than about 150 microns. As shown in FIG. 1-2, which depicts a top down view of the microelectronic assembly 100, the first element 102 may be in the form a framed region 116 surrounding a central aperture 118. The central aperture 118 may be sized to accommodate a first microelectronic element 120, which can be electrically connected to conductors disposed at the first surface 110 of the substrate as discussed below. A second microelectronic element 122 may be supported at the second surface 106 of the first element 102. The second microelectronic element may be electrically connected to the first microelectronic element 120 and/or to components external to the microelectronic assembly 100 as discussed below.

Figure 2:
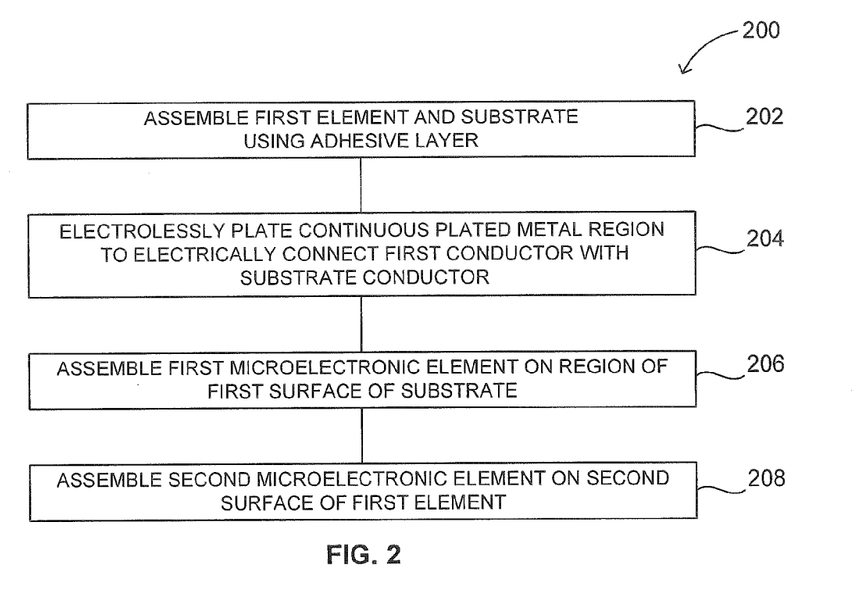
FIG. 2 depicts a flow chart for a method of assembling the assembly of FIG. 1 in accordance with some embodiments of the present invention.

FIG. 2 depicts a flow chart for a method 200 of forming an assembly in accordance with some embodiments of the present invention. The method 200 is described below in accordance with FIGS. 3A-C and FIG. 1.

Figure 3A:
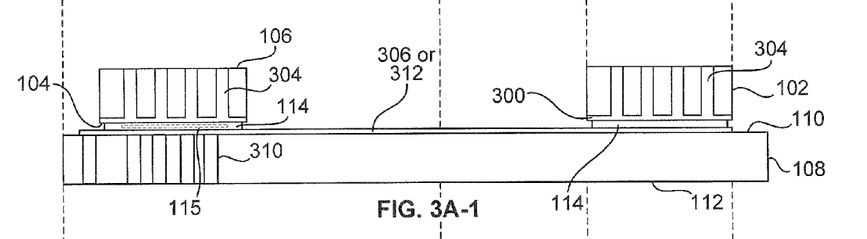

At 202, the first element 102 and the substrate 108 may be assembled using the adhesive layer 114 as illustrated in FIG. 3A-1. In one embodiment, the adhesive layer may be electrically insulating, or comprise an electrically insulating material. The first element 102 and substrate 108 may be assembled in any suitable manner, such as by bonding one surface of the adhesive layer 114 to one of the first surfaces 104, 110 and then contacting a non-bonded surface of the adhesive layer 114 to the remaining first surface 104, 110. In one embodiment, the adhesive layer 114 may be discontinuous, for example, such as including a plurality of adhesive layers 114 provided as strips, discreet finite geometric shapes, or the like. In one embodiment, a plurality of adhesive layers 114 may be bonded to one of the first surfaces 104, 110, and then the plurality of adhesive layers 114 may be bonded to remaining first surface 104, 110. In one embodiment, one or more adhesive layers 114 may be bonded to each of the first surfaces 104, 110 and then the non-bonded surfaces of the one or more adhesive layers 114 may be bonded to each other. The adhesive layer 114 may be a conductive adhesive layer, or may be a composite structure, such as having a plurality of adhesive layers, wherein at least one of the adhesive layers being a conductive adhesive layer. In one embodiment, one or more adhesive layers 114 may include a conductive adhesive layer 115. The conductive adhesive layer 115 may act as a heat sink, electrical ground, or both. For example, the conductive adhesive layer can be insulated such that the conductive adhesive layer does not form a conducting path between one or more of a first conductor 300 and a substrate conductor 306, adjacent first conductors 300, or adjacent second conductors 306. First conductors 300 and substrate conductors 306 are discussed further below. For example, the conductive adhesive layer 115 may be encapsulated by one or more additional adhesive layers 114 that are electrically insulating (as illustrated in FIG. 3A-1), or the conductive adhesive layer may be sufficiently far removed from a first conductor 300 and a substrate conductor 306 such that any electroless plating that may occur on the conductive adhesive layer does not short a first conductor 300 and a substrate conductor 306, or adjacent first conductors 300, or adjacent substrate conductors 306. Other suitable embodiments for bonding the first surfaces 104, 110 may be contemplated using a plurality of adhesive layers 114 and/or a plurality of adhesive materials.

Figure 3A:
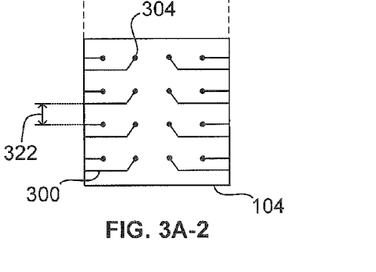
Figure 3A:
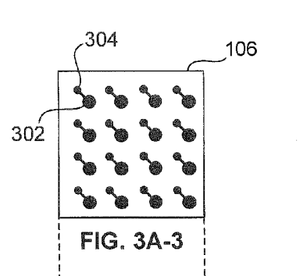

The first element 102 is depicted in cross sectional, top down and bottom up views in FIGS. 3A-(1-3) in accordance with some embodiments of the present invention. The first element may consist essentially of at least one of dielectric or semiconductor material. Exemplary dielectric materials may include one or more of inorganic, laminated, composite or polymeric dielectric materials, such as polyimide, poly chlorinated biphenyl (PCB), polypropylene, epoxy, acrylic, silicon dioxide ($SiO_2$). Exemplary semiconductor materials may include one or more of silicon (Si), gallium arsenide (GaAs), or the like. In one embodiment, the first element may consist essentially of a dielectric material. The first element 102 may be a single layer or a plurality of layers. For example, the first element 102 may consist essentially of one of a single semiconductor layer or a plurality of semiconductor layers. Alternatively, the first element 102 may consist essentially of one of a single dielectric layer or a plurality of dielectric layers.

The first element 102 may include a first conductor 300 at the first surface 104 of the first element 102 as depicted in a bottom up view of the first element 102 in FIG. 3A-2. As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

Exemplary conductive materials for the first conductor 300 may include one or more of gold (Au), nickel (Ni), copper (Cu), Au alloys, Ni alloys, Cu alloys, nickel phosphorus (NiP), nickel boron (NiB), nickel tungsten (NiW), nickel tungsten phosphorus (NiWP), palladium phosphorus (PdP), cobalt (Co), cobalt alloys, cobalt tungsten phosphorus (CoWP), or the like. The first conductor 300 may be one of a plurality of first conductors 300 exposed at the first surface 104 of the first element 102. The first conductor may be one of a trace or a pad. In one embodiment, as shown in FIG. 3A-2, each first conductor 300 may extend along the first surface 104 to a peripheral edge thereof.

The first element 102 may include a second conductor 302 at the second surface 106 of the first element 102 as depicted in a top down view of the first element 102 in FIG. 3A-3. The second conductor 302 may comprise one or more conductive materials as discussed above with regards to the first conductor 104. The second conductor may be one of a plurality of second conductors 302 exposed at the second surface 106 of the first element 102. The second conductor 302 may be one of a trace or a pad. In one embodiment, as depicted in FIG. 3A-3, each second conductor 302 is a pad.

The first element 102 may include an interconnect structure 304 extending in a direction between the first and second surfaces 104, 106 of the first element 102 as depicted in side cross sectional view in FIG. 3A-1. The interconnect structure 304 may electrically connect a second conductor 302 with a corresponding first conductor 300. In one embodiment, as shown in FIGS. 3A-(1-3), each first conductor 300 is electrically connected to a corresponding second conductor 302 through one of a plurality of interconnect structures 304. For example, the interconnect structure 304 can be a through silicon via.

Figure 3A:
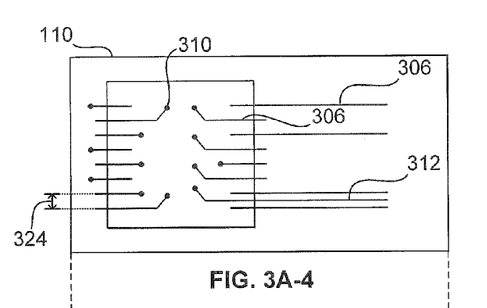
Figure 3A:
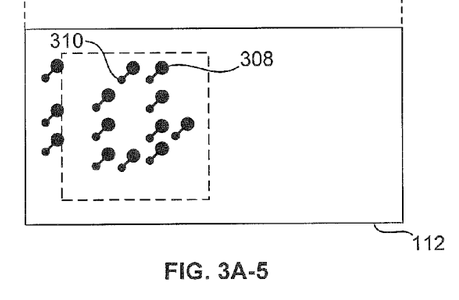

The substrate 108 is depicted in cross sectional, top down and bottom up views in FIGS. 3A-(1, 4-5). The substrate 108 may consist essentially of one of dielectric or semiconductor materials. Exemplary dielectric materials may include one or more of those dielectric materials discussed above. Exemplary semiconductor materials may include one or more of those semiconductor materials discussed above. In one embodiment, the substrate 108 may consist essentially of a dielectric material. The substrate 108 may consist essentially of a single layer or a plurality of layers. For example, the substrate 108 may consist essentially of one of a single semiconductor layer or a plurality of semiconductor layers. Alternatively, the substrate 108 may consist essentially of one of a single dielectric layer or a plurality of dielectric layers.

The substrate 108 may include a substrate conductor 306 at the first surface 110 of the substrate 108 as depicted in a top down view of the substrate 108 in FIG. 3A-4. The substrate conductor 306 may comprise one or more conductive materials similar to conductive materials discussed above with regards to the first conductor 104. The substrate conductor 306 may be one of a plurality of substrate conductor 306 exposed at the first surface 110 of the substrate 108. The substrate conductor 306 may be one of a trace or a pad. In one embodiment, as depicted in FIG. 3A-4, each substrate conductor 306 is a trace. Each substrate conductor 306 may be configured to electrically connect to at least one of a microelectronic element, such as the first microelectronic element 120, or a terminal 308 as discussed below.

The substrate 108 may include the terminal 308 at the second surface 112 of the substrate 108 as depicted in a bottom up view of the substrate 108 in FIG. 3A-5. The terminal 308 may comprise one or more conductive materials similar to conductive materials discussed above with regards to the first conductor 104. The terminal 308 may be one of a plurality of terminals 308 exposed at the second surface 112 of the substrate 108. For example, each terminal 308 may be one of a trace or a pad. In one embodiment, as depicted in FIG. 3A-5, each terminal 308 is a pad.

The substrate 108 may include a second interconnect structure 310 extending in a direction between the first and second surfaces 110, 112 of the substrate 108 as depicted in side cross sectional view in FIG. 3A-1. The second interconnect structure 310 may be electrically connected to the terminal 308 at the second surface 112 as depicted in FIG. 3A-5. The second interconnect structure 310 may be one of a plurality of second interconnect structures 310. In one embodiment, as depicted in FIG. 3A-4, ones of the plurality of substrate conductors 306 may be electrically connected to corresponding ones of the plurality of terminals 308 through ones of the plurality of second interconnect structures 310, others of the plurality of substrate conductors 306 may not be electrically connected to ones of the plurality of second interconnect structures 310, and ones of a plurality of contacts 312 may be electrically connected to corresponding ones of the plurality of terminals 308 through ones of the plurality of second interconnect structures 310. A substrate conductor 306 and a contact 312 may be substantially similar, except a substrate conductor 306 can be electrically connected to a first conductor 300 as discussed below. A contact 312 cannot be electrically connected to a first conductor 300.

Figure 3B:
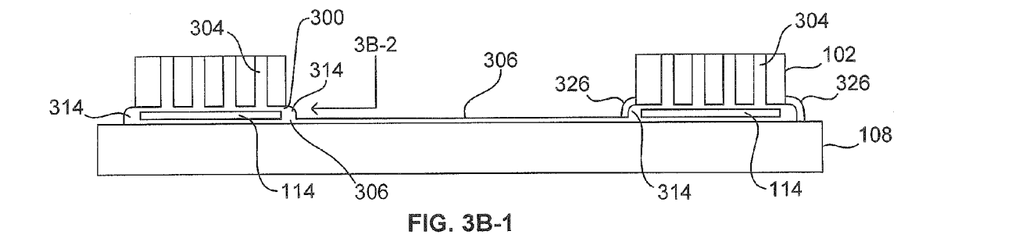
Figure 3B:
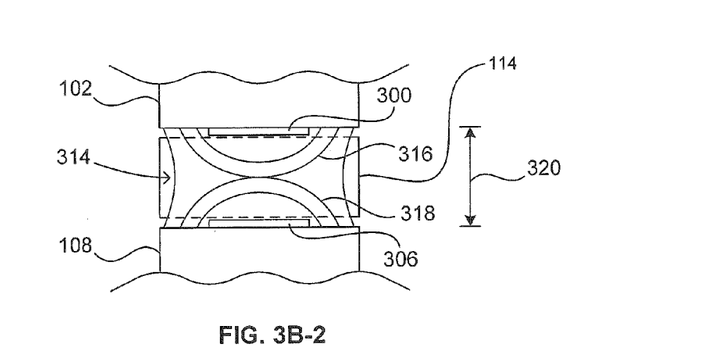

As illustrated in FIG. 3A-1, the adhesive layer 114 may be such that at least portions of the first conductor 300 and the substrate conductor 306 may be exposed at an edge of the adhesive layer 114. For example, the adhesive layer 114 may be configured such that at least portions of the first conductor 300 and the substrate conductor 306 may be exposed at the edge of the adhesive layer 114 upon assembly of the first element 102 and the substrate 108 using the adhesive layer 114. Alternatively, the at least potions of the first conductor 300 and the substrate conductor 306 may be exposed at the edge of the adhesive layer 114 after assembly of the first element 102 and the substrate 108. At 204, a continuously electroless plated metal region 314 may be electrolessly plated to electrically connect the first conductors 300 and the substrate conductors 306 as depicted in FIGS. 3B-(1-2). In one embodiment, the continuous electroless plated metal region 314 may be utilized to electrically connect the at least portions of the first conductor 300 and the substrate conductor 306 exposed at the edge of the adhesive layer 114. The continuous electroless plated metal region 314 may extend beyond the edge of the adhesive layer 114. For example, in one embodiment, the continuous electroless plated metal region 314 may not contact the edge of the adhesive layer 114. In one embodiment, as depicted in FIG. 3B-1, the continuous electroless plated metal region 314 extends along the edge of the adhesive layer 314.

As used herein, a continuous electroless plated metal region extending between first and second electrically conductive elements is a structure which includes first and second electroless plated metal regions deposited on the first and second conductive elements, respectively, the continuous electroless plated metal region formed by the merging together of the first and second electroless plated metal regions during the electroless deposition of the first and second electroless plated metal regions. Thus, in the embodiment seen in FIG. 3B-1, a continuous electroless plated metal region 314 extending between a first conductor 300 and a substrate conductor 306 includes first and second plated metal regions 316, 318 which are electrolessly deposited on the first conductor 300 and the second plated metal region 318, respectively, the continuous electroless plated metal region 314 formed by the merging together of the first and second electroless plated metal regions 316, 318 during the electroless deposition of the first and second electroless plated metal regions 316, 318.

The continuous electroless plated metal region 314 may be one of a plurality of continuously electroless plated metal regions 314, each continuous electroless plated metal region 314 electrically connecting a first conductor of the plurality of first conductors 300 with a corresponding substrate conductor of the plurality of substrate conductors 306. As depicted in FIG. 3B-2, each continuous electroless plated metal region 314 may have an hour glass-like shape, wherein opposing dome-shaped structures of the first and second electroless plated metal regions 316, 318 interface at the apex of each dome-shaped structure to form the continuous electroless plated metal region 314. Each of the first and second electroless plated metal regions may be formed from one or more metals, such as one or more of Nickel (Ni), copper (Cu), or any of the conductive materials discussed above in regards to the first conductor 300. In one embodiment, each of the first and second electroless plated metal regions 316, 318 may have an inner layer including Ni and an outer layer including Cu.

Among the distinctions between electroless plated metal regions, and metal regions which have been plated using an electrical power source, may include composition. For example, electroless plated metal regions may have different metals from the conductors, such as the first conductor 300 and the substrate conductor 306, on which the electroless plated metal regions are deposited. However, metal regions plated by an electrical power source comprise the same metals as the conductors on which the regions are deposited.

Each continuous electroless plated metal region 314 may exist only as a connection between one of the plurality of first conductors 300 and one of the plurality of substrate conductors 306 bridging a minimum distance 320 therebetween. In one embodiment, some of the first conductors 300 and corresponding ones of the substrate conductors 306 may be coupled only to each other through the continuous electroless plated metal region 314 and not to other elements, such as an interconnect structure 304, second interconnect structure 310, terminal 308, or second conductor 302. The distance between each first conductor 300 and corresponding substrate conductor 306 may be defined by the adhesive layer 114 and optionally, one or more dielectric layers disposed between the adhesive layer 114 and one or more of the first surfaces 104, 110. The minimum distance 320 between each first conductor 300 and each corresponding substrate conductor 306, a first pitch 322 (depicted in FIG. 3A-2) between adjacent first conductors 300, and a second pitch 324 (depicted in FIG. 3A-4) between adjacent substrate conductors 306 are such that adjacent continuous electroless plated metal regions 318 do not merge. In one embodiment, the minimum distance 320 between each first conductor 300 and each corresponding substrate conductor 306 may be less than about 20 microns. In one embodiment, the minimum distance 320 between each first conductor 300 and each corresponding substrate conductor 306 may be less than about 10 microns. In one embodiment, the first pitch 322 is less than about 150 microns. In one embodiment, the second pitch 324 is less than about 150 microns. In one embodiment, the first and second pitches 322, 324 are each greater than about 1.2 times the minimum distance 320.

Optionally, an encapsulant 326 may be used to cover the continuous electroless plated metal region 314 as depicted in FIG. 3B-1. The encapsulant 326 may be a thermoset material, such as a thermoset material that can be used for flip-chip underfill, overmolding, or the like.

Figure 3C:
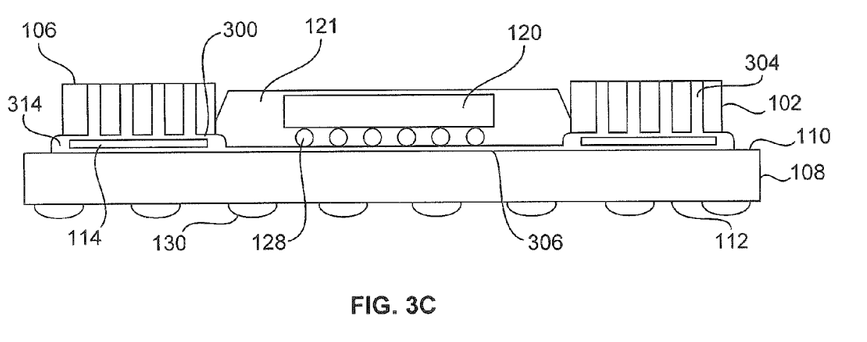
FIG. 3C depicts a side cross sectional view of a partially formed assembly in accordance with some embodiments of the present invention.

At 206, the first microelectronic element 120 may be assembled on the first surface 110 of the substrate 108 and within the central aperture 118 of the first element 102 as depicted in FIG. 3C. The first microelectronic element 120 may be electrically connected to ones of the plurality of terminals 308 through ones of the plurality of contacts 312. The first microelectronic element 120 may be electrically connected to ones of the plurality of second conductors 302 exposed at the second surface 106 of the first element 102 through ones of the plurality of substrate conductors 306. As depicted in FIG. 3C, a covering 121 may overlie the microelectronic element 120, such as on a side of the microelectronic element 120 opposite from the substrate 108.

At 208, the second microelectronic element 122 may be assembled at the second surface 106 of the first element 102. The second microelectronic element 122 may be electrically connected to ones of the plurality of terminals 308 through ones of plurality of second conductors 302. The second microelectronic element 122 may be electrically connected to the first microelectronic element through ones of plurality of second conductors 302. In one embodiment, as depicted in FIG. 1-1, the first and second microelectronic elements 120, 122 may be electrically connected to ones of the plurality of substrate conductors 306 and ones of the plurality of second conductors 302, respectively, by ones of a plurality of solder balls 128. In one embodiment, ones of a plurality of solder balls 130 may be disposed on each terminal 308 to provide a means for electrically connected the assembly 100 to an external component, such as a power source or the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. An assembly, comprising:
a substrate consisting essentially of dielectric material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal;
a first element consisting essentially of dielectric material, having a first surface facing the first surface of the substrate and a second surface opposite the first surface, a first conductor at the first surface, a second conductor at the second surface, and interconnect structure extending through the first element electrically connecting the first and second conductors;
an adhesive layer bonding the first surfaces of the first element and the substrate with one another, portions of the first conductor and the substrate conductor being disposed beyond a peripheral edge of the adhesive layer; and
a continuous electroless plated metal region disposed beyond the peripheral edge of the adhesive layer, the continuous electroless plated metal region extending between the portions of the first conductor and the substrate conductor and extending to a height above the first surface of the substrate, wherein the height is less than a height that the second surface of the first element extends above the first surface of the substrate.

2. The assembly of claim 1, wherein the continuous electroless deposited metal region includes a first metal region electrolessly deposited onto the first conductor and a second metal region electrolessly deposited onto the substrate conductor, each of the first and second metal regions including a first electroless deposited metal layer and a second electroless deposited metal layer covering the first layer.

3. The assembly of claim 2, wherein the first and second electroless deposited metal layers are formed of one or more materials selected from the group consisting of cobalt (Co), nickel (Ni), copper (Cu), gold (Au), Co alloys, Ni alloys, Cu alloys, or Au alloys.

4. The assembly of claim 1, wherein each of the first conductor and the substrate conductor includes a metal at a surface thereof, wherein the continuous electroless plated metal region includes a metal different from the metal at the surfaces of the first conductor and the substrate conductor.

5. The assembly of claim 1, wherein a minimum distance between the first conductor and the substrate conductor is less than about 20 microns.

6. The assembly of claim 1, wherein the first conductor is one of a plurality of first conductors at the first surface of the first element, the substrate conductor is one of a plurality of substrate conductors at the first surface of the substrate, and the continuous electroless plated metal region is one of a plurality of continuous electroless plated metal regions, each continuous electroless plated metal region extending between a first conductor of the plurality of first conductors and a corresponding substrate conductor of the plurality of substrate conductors, wherein the electroless plated metal regions formed on first and second adjacent pairs of one first conductor with one substrate conductor are spaced apart from one another.

7. The assembly of claim 6, wherein the second conductor is one of a plurality of second conductors exposed at the second surface of the first element, the plurality of second conductors being electrically connected with the plurality of first conductors by the interconnect structure.

8. The assembly of claim 6, wherein a minimum first pitch between adjacent ones of the first conductors is less than about 200 microns.

9. The assembly of claim 6, wherein a minimum second pitch between adjacent ones of the substrate conductors is less than about 200 microns.

10. The assembly of claim 6, wherein each first conductor is spaced apart from the corresponding substrate conductor connected therewith by at least a minimum distance, at least a minimum first pitch is provided between adjacent ones of the first conductors and at least a minimum second pitch is provided between adjacent ones of the second conductors, wherein each of the first and second minimum pitches is greater than 1.2 times the minimum distance.

11. The assembly of claim 6, wherein the terminal is one of a plurality of terminals exposed at the second surface of the substrate, and wherein the substrate further comprises:
a plurality of second interconnect structures, each second interconnect structure extending in a direction between the first and second surfaces of the substrate, ones of the plurality of terminals electrically connected with ones of the plurality of substrate conductors through at least one interconnect structure.

12. The assembly of claim 11, wherein ones of the plurality of terminals are electrically connected to ones of the plurality of second conductors through ones of the continuous electroless plated metal regions.

13. The assembly of claim 11, wherein the contact is one of a plurality of contacts at the surface of the substrate, the plurality of terminals being electrically connected with the contacts.

14. The assembly of claim 13, wherein the first element is in the form of an element having a framed region surrounding a central aperture, the central aperture sized to accommodate a microelectronic element.

15. The assembly of claim 14, further comprising:
a first microelectronic element electrically connected with the contact, at least a portion of the thickness of the first microelectronic element being disposed within the central aperture of the first element.

16. The assembly of claim 15, wherein the first microelectronic element is electrically coupled to ones of the plurality of terminals through ones of the plurality of contacts.

17. The assembly of claim 15, wherein the first microelectronic element is electrically coupled to ones of the plurality of second conductors through ones of the plurality of substrate conductors.

18. The assembly of claim 15, further comprising:
a second microelectronic element supported at the second surface of the first element.

19. The assembly of claim 18, wherein the second microelectronic element is electrically connected to ones of the plurality of terminals through ones of the plurality of second conductors.

20. The assembly of claim 18, wherein the second microelectronic element is electrically connected to the first microelectronic element through ones of the plurality of second conductors.

21. The assembly of claim 1, wherein the adhesive layer is a conductive adhesive layer, the conductive adhesive layer insulated from the first conductor and the substrate conductor.

22. The assembly of claim 1, wherein the height that the second surface of the first element extends above the first surface of the substrate is greater than about 200 microns.

23. The assembly of claim 1, wherein at least one of the first element or the substrate consists essentially of a single dielectric layer or a plurality of dielectric layers.

24. The assembly of claim 1, wherein the adhesive layer is one of a plurality of layers.

25. The assembly of claim 1, wherein the adhesive layer is comprised of an electrically insulating material.

26. An assembly, comprising:
a substrate consisting essentially of semiconductor material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal;
a first element consisting essentially semiconductor material, having a first surface facing the first surface of the substrate and a second surface opposite the first surface, a first conductor at the first surface, a second conductor at the second surface, and a through silicon via extending through the first element electrically connecting the first and second conductors;
an adhesive layer bonding the first surfaces of the first element and the substrate with one another, portions of the first conductor and the substrate conductor being disposed beyond a peripheral edge of the adhesive layer; and
a continuous electroless plated metal region disposed beyond the peripheral edge of the adhesive layer, the continuous electroless plated metal region extending between the portions of the first conductor and the substrate conductor and extending to a height above the first surface of the substrate, wherein the height is less than a height that the second surface of the first element extends above the first surface of the substrate.

27. An assembly, comprising:
- a substrate consisting essentially of dielectric material, having a first surface, a second surface opposite the first surface of the substrate, a substrate conductor and a contact at the first surface, and a terminal at the second surface for electrically interconnecting the assembly with a component external to the assembly, at least one of the substrate conductor or the contact being electrically connected with the terminal;
- a first element consisting essentially of dielectric material, having a first surface facing the first surface of the substrate and a second surface opposite the first surface, a first conductor at the first surface, a second conductor at the second surface, and interconnect structure extending through the first element electrically connecting the first and second conductors;
- an adhesive layer bonding the first surfaces of the first element and the substrate with one another, portions of the first conductor and the substrate conductor being disposed beyond a peripheral edge of the adhesive layer;
- a continuous electroless plated metal region disposed beyond the peripheral edge of the adhesive layer, the continuous electroless plated metal region extending between the portions of the first conductor and the substrate conductor and extending to a height above the first surface of the substrate, wherein the height is less than a height that the second surface of the first element extends above the first surface of the substrate;
- a first microelectronic element electrically connected with at least one of the substrate conductor or the contact, at least a portion of the thickness of the first microelectronic element being disposed within the central aperture of the first element; and
- a second microelectronic element supported at the second surface of the first element, the second microelectronic element electrically connected with the second conductor.

* * * * *